(12) United States Patent
Cok et al.

(10) Patent No.: US 7,294,959 B2
(45) Date of Patent: Nov. 13, 2007

(54) OLED DEVICE HAVING IMPROVED CONTRAST

(75) Inventors: Ronald S. Cok, Rochester, NY (US); Michael L. Boroson, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 67 days.

(21) Appl. No.: 11/257,312

(22) Filed: Oct. 24, 2005

(65) Prior Publication Data

US 2007/0090751 A1 Apr. 26, 2007

(51) Int. Cl.
*H05B 33/00* (2006.01)

(52) U.S. Cl. ............... 313/501; 313/503; 313/504; 313/505; 313/506; 313/512

(58) Field of Classification Search ........ 313/110, 313/112, 501, 504
See application file for complete search history.

(56) References Cited

U.S. PATENT DOCUMENTS

| | | | |
|---|---|---|---|
| 6,476,783 B2 * | 11/2002 | Matthies et al. | 345/82 |
| 6,919,681 B2 | 7/2005 | Cok et al. | |
| 2004/0113875 A1 * | 6/2004 | Miller et al. | 345/82 |
| 2004/0189196 A1 * | 9/2004 | Cok | 313/512 |
| 2005/0122053 A1 | 6/2005 | Ko | |

* cited by examiner

*Primary Examiner*—Nimeshkumar D. Patel
*Assistant Examiner*—Conrad R Blease
(74) *Attorney, Agent, or Firm*—Andrew J. Anderson; Stephen H. Shaw

(57) ABSTRACT

A full-color organic light-emitting diode (OLED) device, comprising: a) a plurality of light emitting OLED pixels, each pixel having three or more color light-emitting elements for emitting different colors of light specifying a gamut and at least one additional light-emitting element for emitting a color of light within the gamut and wherein the power efficiency of the additional element is higher than the power efficiency of at least one of the three or more gamut elements; and b) a patterned neutral density filter selectively filtering the emitted light from the additional light emitting element.

15 Claims, 4 Drawing Sheets

OLED DEVICE HAVING IMPROVED CONTRAST

FIELD OF THE INVENTION

The present invention relates to organic light-emitting diode (OLED) devices and, more particularly, to an OLED device having improved light output and contrast.

BACKGROUND OF THE INVENTION

Organic light-emitting diode (OLED) devices, also referred to as organic electroluminescent (EL) devices, have numerous well-known advantages over other flat-panel display devices currently in the market place. Among the potential advantages is brightness of light emission, relatively wide viewing angle, reduced device thickness, and reduced electrical power consumption compared to, for example, liquid crystal displays (LCDs) using backlighting.

Applications of OLED devices include active-matrix image displays, passive-matrix image displays, and area-lighting devices such as, for example, selective desktop lighting. Irrespective of the particular OLED device configuration tailored to these broad fields of applications, all OLEDs function on the same general principles. An organic electroluminescent (EL) medium structure is sandwiched between two electrodes. At least one of the electrodes is at least partially light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the OLED is said to be forward biased. Positive charge carriers (holes) are injected from the anode into the EL medium structure, and negative charge carriers (electrons) are injected from the cathode. Such charge carrier injection causes current flow from the electrodes through the EL medium structure. Recombination of holes and electrons within a zone of the EL medium structure results in emission of light from this zone that is, appropriately, called the light-emitting zone or interface. The organic EL medium structure can be formed of a stack of sublayers that can include small molecule layers or polymer layers. Such organic layers and sublayers are well known and understood by those skilled in the OLED art.

Full-color OLED devices may employ a variety of organic materials to emit different colors of light. In such arrangement, the OLED device is patterned with different sets of organic materials, each set of organic materials associated with a particular color of light emitted. Each pixel in an active-matrix full-color OLED device typically employs each set of organic materials, for example to form a red, green, and blue sub-pixel element. The patterning is typically done by evaporating layers of organic materials through a mask. In an alternative arrangement, a single set of organic materials emitting broadband light may be deposited in continuous layers on the substrate, and a full-color OLED device formed by employing an array of differently colored filters in combination with the broadband emitted light.

The emitted light is directed towards an observer, or towards an object to be illuminated, through the light transmissive electrode. If the light transmissive electrode is between the substrate and the light emissive elements of the OLED device, the device is called a bottom-emitting OLED device. Conversely, if the light transmissive electrode is not between the substrate and the light emissive elements, the device is referred to as a top-emitting OLED device. The present invention may be directed to either a top-emitting or bottom-emitting OLED device. Reflective electrodes may be made of relatively thick and electrically conductive metal compositions that can be optically opaque, for example employing metals such as silver or aluminum or alloys employing such metals. Typical prior-art materials proposed for transparent electrodes include indium tin oxide (ITO) and very thin layers of metal, for example silver, aluminum, or magnesium or metal alloys including silver, aluminum, or magnesium.

Referring to FIG. 2, a top-emitting OLED device as suggested by the prior art is illustrated having a substrate 10 (either reflective, transparent, or opaque). Over the substrate 10, a semiconducting layer is formed providing thin-film electronic components 30 for driving an OLED. An interlayer insulating and planarizing layer 32 is formed over the thin-film electronic components 30 and a patterned reflective electrode 12 defining OLED light-emissive elements is formed over the insulating layer 32. An inter-pixel insulating film 34 separates the elements of the patterned reflective electrode 12. One or more first layers 14 of organic material, one of which emits light, are formed over the patterned reflective electrode 12. A transparent second electrode 16 is formed over the one or more first layers 14 of organic material. A gap separates the transparent second electrode 16 from an encapsulating cover 20. The encapsulating cover 20 is transparent and may be coated directly over the transparent electrode so that no gap exists. In some prior-art embodiments, the first electrode 12 may instead be at least partially transparent and/or light absorbing.

As shown in FIG. 2, the organic layers 14 need not be patterned, and broadband light, for example white light, can be emitted from the organic layers 14, through the color filters 24R, 24G, and 24B to form a color display. The color filters 24R, 24G, and 24B, transmit only a desired color of light, for example red, green, and blue corresponding, for example to the desired colors in a color display. The colored light 50, 51, 52 then passes through the cover 20 and is emitted from the device. The active-matrix thin-film electronic components 30, for example bus wires, capacitors, thin-film transistors and the like may be employed to provide power to the OLED elements. Alternatively, as is known in the prior art, a passive-matrix control scheme with separate power lines for each row or column of OLED elements may be employed to provide power to the OLED elements. Alternatively, the organic layers 14 may be patterned so that differently colored light is emitted from different locations on the device.

OLED materials have different light emission properties, and it is known that some colors of light are emitted more efficiently than others, in particular white emitters are known that have an efficiency higher than that of both blue and red emitters. Hence, it has been proposed to employ OLED pixels having four sub-elements: red, green, blue, and white (RGBW). Because most images have a large luminance component, such four-element displays can be more efficient than conventional three-element displays. Such designs are described, for example, in U.S. Pat. No. 6,919,681 and US2004/0113875.

Referring to FIG. 3, a top-emitting OLED device having four sub-elements: red, green, blue, and white (RGBW) is illustrated. In this arrangement, the organic layers 14 emit broadband, for example substantially white, light that passes through the color filters 24R, 24G, and 24B. The light emitted from the fourth sub-pixel is typically unfiltered.

However, if the color of the white light does not match the desired white-point of the device, white point adjusting filters or white color filters are disclosed in U.S. Pat. No. 6,919,681 and US2004/0113875 for possible use with the broad-band white light emitting elements for modifying the color of emitted light if desired. The designs of both FIGS. 2 and 3 may also be applied to a bottom-emitting structure. In particular, a bottom-emitting version of FIG. 3 has been constructed by Applicant.

In many OLED display applications, it is necessary to employ an OLED display outdoors in high brightness ambient conditions since flat-panel display devices are widely used in conjunction with communication devices and in particular with portable devices. These displays are often used outdoors or in public areas with significant ambient illumination. In these locations, the contrast of the display is of great concern. In particular, OLED display devices suffer from problems with contrast since the back electrode of the devices is typically highly reflective.

It is known to employ circular polarizers with flat-panel OLED displays to reduce the reflection of ambient light on the front of the flat-panel displays and thereby improve the contrast of the display. Circular polarizers are known to improve contrast in light emitting displays, for example, as disclosed in US2004/0189196. Circular polarizers comprise a linear polarizer and a quarter-wave plate. Light (such as emitted light) that passes through the quarter wave plate and polarizer once is polarized. Light (such as ambient light) that passes first through the polarizer, then the quarter-wave plate and is subsequently reflected back through the quarter-wave plate and the filter is largely absorbed. However, such circular polarizers are expensive.

It is also known to employ neutral density filters to improve the contrast of an emissive display device. For example, a neutral density filter may be applied to all of the pixel sub-elements in common. Alternatively, an actively-controlled filter may be employed. US20050122053 A1 entitled "Organic electroluminescent display" describes an organic electroluminescent display having a transparent display panel, a reflective sheet and a brightness regulating film between the substrate and the reflective sheet. The regulating film is able to adjust the light intensity transmitting of the OLED display in response the level of ambient illumination by using a photochromic material. In these designs, light emitted by each of the OLED elements will be absorbed by some amount determined by the density of the neutral density filter. Ambient light that is reflected and re-emitted through the neutral density filter will be absorbed twice in an amount equal to the square of the absorption amount, thereby improving the contrast of the device. However, as taught in the prior art such a solution also reduces the brightness of the color emitters and the efficiency of the display is reduced.

There is a need therefore for an improved organic light-emitting diode device structure that increases the light output and improves contrast.

SUMMARY OF THE INVENTION

In accordance with one embodiment, the invention is directed towards a full-color organic light-emitting diode (OLED) device, comprising: a) a plurality of light emitting OLED pixels, each pixel having three or more color light-emitting elements for emitting different colors of light specifying a gamut and at least one additional light-emitting element for emitting a color of light within the gamut and wherein the power efficiency of the additional element is higher than the power efficiency of at least one of the three or more gamut elements; and b) a patterned neutral density filter selectively filtering the emitted light from the additional light emitting element.

ADVANTAGES

The present invention has the advantage that it increases the light output and contrast of an OLED device.

It will be understood that the figures are not to scale since the individual layers are too thin and the thickness differences of various layers too great to permit depiction to scale.

DETAILED DESCRIPTION OF THE INVENTION

In accordance with one embodiment of the present invention, a full-color organic light-emitting diode (OLED) device, comprises a plurality of light emitting OLED pixels, each pixel having three or more color light-emitting elements for emitting different colors of light specifying a gamut and at least one additional light-emitting element for emitting a color of light within the gamut and wherein the power efficiency of the additional element is higher than the power efficiency of at least one of the three or more gamut elements; and a patterned neutral density filter selectively filtering the emitted light from the additional light emitting element.

Figure 1:
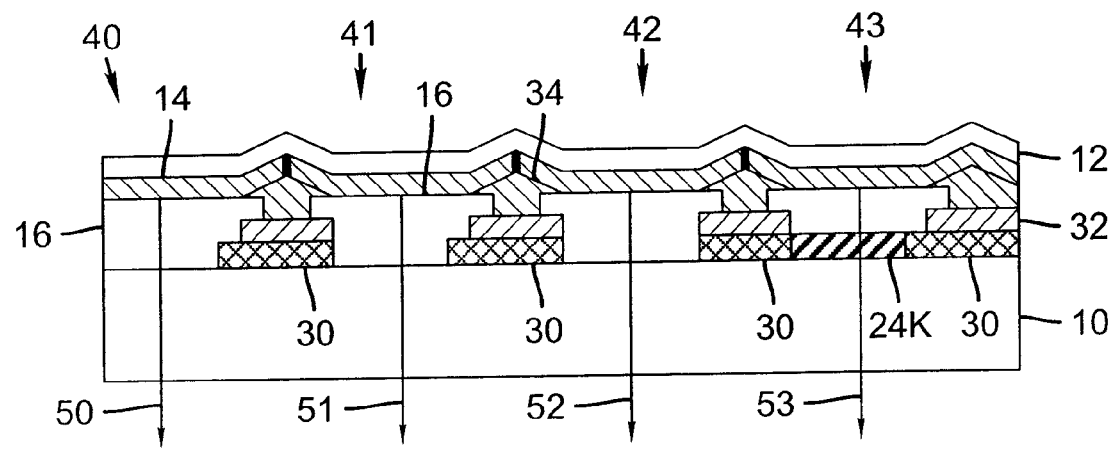
FIG. 1 illustrates a partial cross section of a bottom-emitter OLED device having patterned emitters according to one embodiment of the present invention.

Referring to FIG. 1, in one embodiment of the present invention, an active-matrix, bottom-emitting OLED device has a transparent substrate 10. Over the substrate 10, a semiconducting layer is formed providing thin-film electronic components 30 for driving an OLED. An interlayer insulating and planarizing layer 32 is formed over the thin-film electronic components 30 and a patterned transparent electrode 16 defining OLED light-emissive elements is formed over the substrate 10. An inter-pixel insulating film 34 separates the elements of the patterned transparent electrode 16. One or more first layers 14 of organic material, one of which emits light, are formed over the patterned transparent electrode 16. A reflective second electrode 12, is formed over the one or more first layers 14 of organic material. A gap separates the reflective second electrode 12 from an encapsulating cover (not shown). The encapsulating cover may be opaque or transparent and may be coated directly over the reflective electrode 12 so that no gap exists. In some embodiments, the transparent electrode 16 may be partially reflective and/or light absorbing.

In FIG. 1, the light emissive materials in the organic layer(s) 14 are patterned to emit different colors of light corresponding to color light-emitting elements 40, 41, and 42. At least one additional light-emitting element 43 emits a color of light within the gamut formed by the colors of the other color light-emitting elements 40, 41, and 42, wherein the power efficiency of the additional element 43 is higher than the power efficiency of at least one of the three or more color light-emitting gamut elements 40, 41, and 42. A patterned neutral density filter 24K selectively filters the emitted light from the additional light-emitting element 43.

In operation, upon the application of a current by the electrodes 12 and 16, color light-emitting elements 40, 41, and 42 emit colored light 50, 51, and 52 while light-emitting element 43 emits a light 53 within the gamut formed by the colors emitted by the light-emitting elements 40, 41, and 42. The light 53 may be broadband, for example a white color, and is selectively filtered by patterned neutral density filter 24K. Some portion of the ambient light incident on the OLED device will be absorbed by the neutral density filter 24K. The remainder of the ambient light will be reflected from the reflective second electrode 12 and pass through the neutral density filter 24K again. Because the light 53 passes through neutral density filter 24K once while the incident ambient light passes through the neutral density filter twice, the contrast of the OLED device is improved. The neutral density filter 24K is selected to ensure that the color of the light 53 emitted from the OLED is maintained. In one embodiment of the present invention the neutral density filter absorbs at least 10% of light in the visible spectrum. By employing a patterned neutral density filter to selectively absorb light over the additional light-emitting element 43, contrast may be improved without reducing the luminance of the gamut defining light-emitting elements 40, 41, 42. Since the additional light emitting element is more efficient than at least one of the gamut-defining light-emitting elements, reduction of the luminance of the additional element only preserves the brightness of the less efficient gamut-defining elements.

Figure 4:
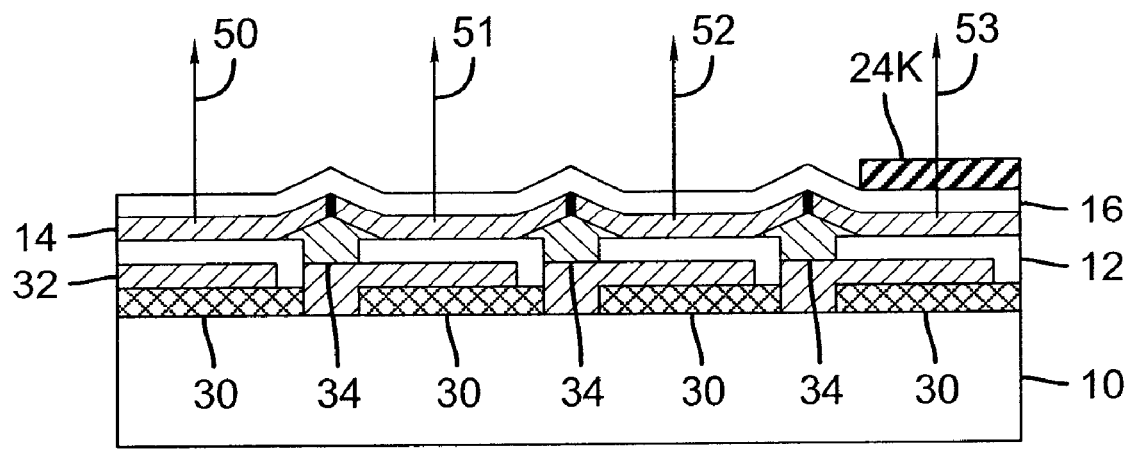
FIG. 4 illustrates a partial cross section of a top-emitter OLED device having patterned emitters according to another embodiment of the present invention.

In an alternative embodiment illustrated in FIG. 4, light is emitted from the top of the OLED device. In this embodiment, the substrate 10 may be opaque while the positions of the reflective electrode 12 and transparent electrode 16 are reversed with respect to the substrate. The neutral density filter 24K may be formed directly on the transparent electrode 16 (or optical or protective layers formed over the electrode) as shown or formed on the inside of an encapsulating cover (as shown for filters 24R, 24G, 24B in FIG. 2). This embodiment has the advantage of enabling a greater area for emitting light since the electronic thin-film components 30 may be located under the reflective electrode 12.

Figure 2:
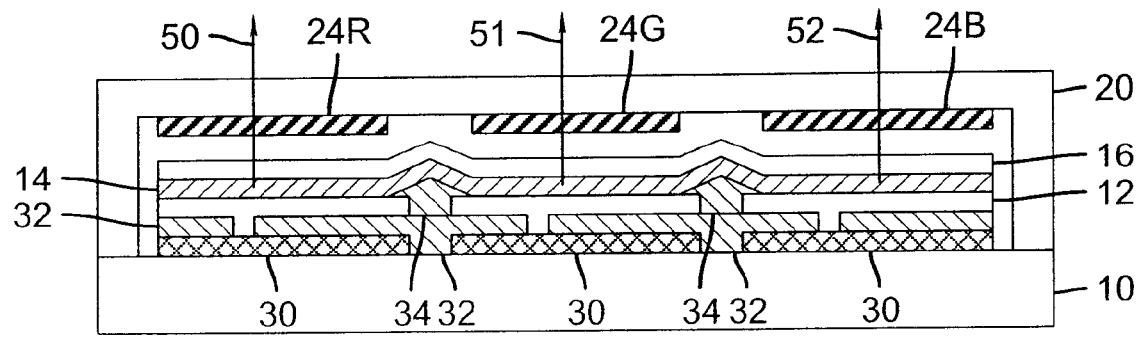
FIG. 2 illustrates a cross section of a top-emitter OLED device employing a broad-band emitter with color filters as suggested by the prior art.
Figure 3:
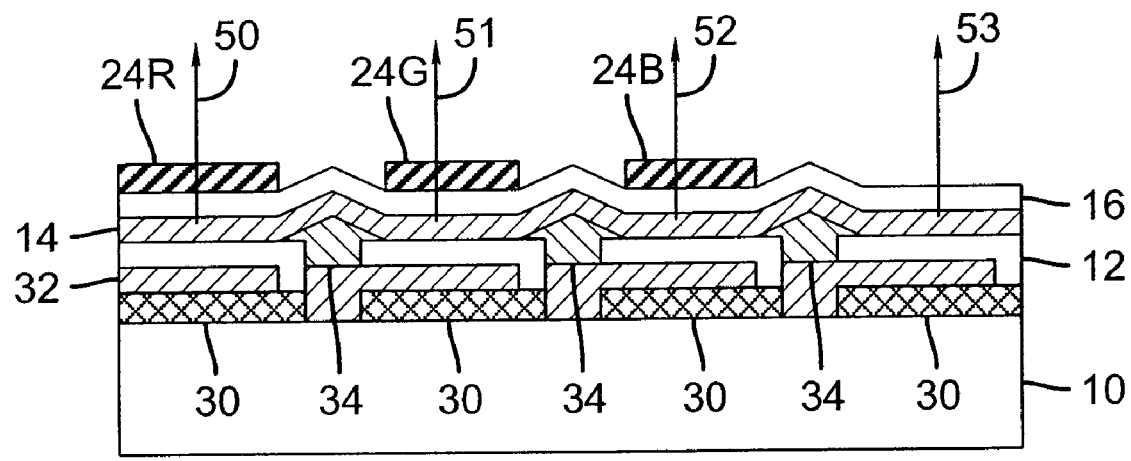
FIG. 3 illustrates a partial cross section of a top-emitter OLED device having four sub-pixels and a broad-band emitter with color filters as suggested by the prior art.
Figure 5:
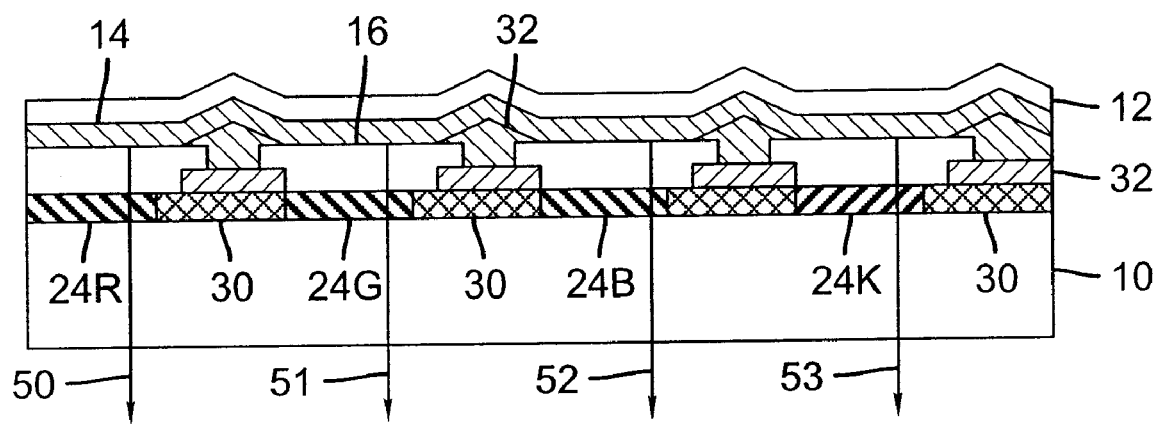
FIG. 5 illustrates a partial cross section of a bottom-emitter OLED device having a broad-band emitter with color filters according to yet another embodiment of the present invention.
Figure 6:
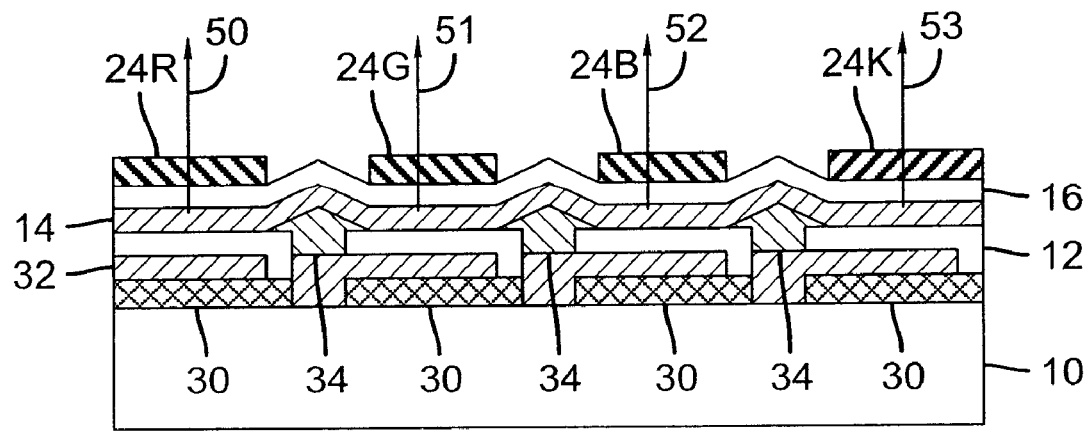
FIG. 6 illustrates a partial cross section of a top-emitter OLED device having a broad-band emitter with color filters according to yet another embodiment of the present invention.

Referring to FIG. 5, in an alternative bottom-emitting embodiment, the organic layers 14 are not patterned and emit a common broadband light. In this embodiment, conventional color filters, for example red 24R, green 24G, and blue 24B may be employed to filter the emitted broadband light to form color light-emitters and may be located, for example, on the substrate 10. In a top-emitter embodiment shown in FIG. 6, the filters are located on the transparent electrode 16 (as shown) or cover (as shown in FIG. 2).

According to the present invention, the neutral density filter 24K may be a polarizing filter, for example a linear polarizer or a circular polarizer, or a dynamic filter, for example a photo-chromic filter or electro-chromic filter. Other filters employing, for example, electrophoresis may also be employed. All of these light filtering technologies are known in the art.

Figure 7:
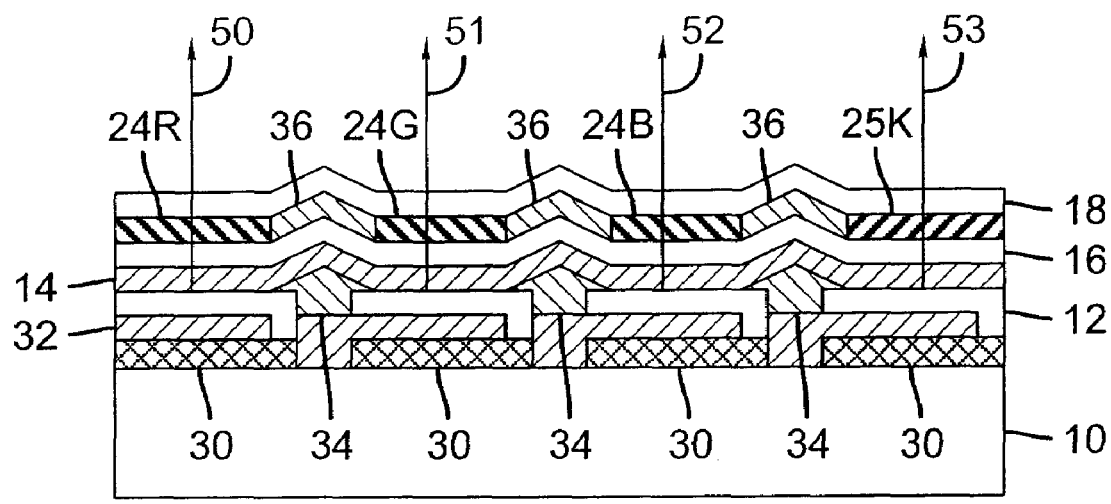
FIG. 7 illustrates a partial cross section of a top-emitter OLED device having a dynamic filter according to yet another embodiment of the present invention.

Referring to FIG. 7, in a further embodiment of the invention, an additional non-patterned transparent electrode 18 is employed over a dynamic patterned neutral density light filter 25K (e.g., comprising an electro-chromic material) to adjust the dynamic light filter 25K to various ambient conditions and thereby optimize the contrast of the OLED device for various applications. The ambient light conditions could be detected, for example, by employing a light sensor controlled by a control circuit integrated into an OLED device controller. Under conditions of brighter ambient light, the dynamic neutral density filter can be made darker and have a greater optical density to absorb more of the ambient light. Alternatively, under conditions of dimmer ambient light, the dynamic neutral density filter can be made lighter and have a lesser optical density to absorb less of the ambient light. In an alternative embodiment, photochromic material may be employed for dynamic patterned neutral density light filter 25K, such that the filter changes its density in response to ambient illumination, in which instance electrode 18 is unnecessary.

Figure 8:
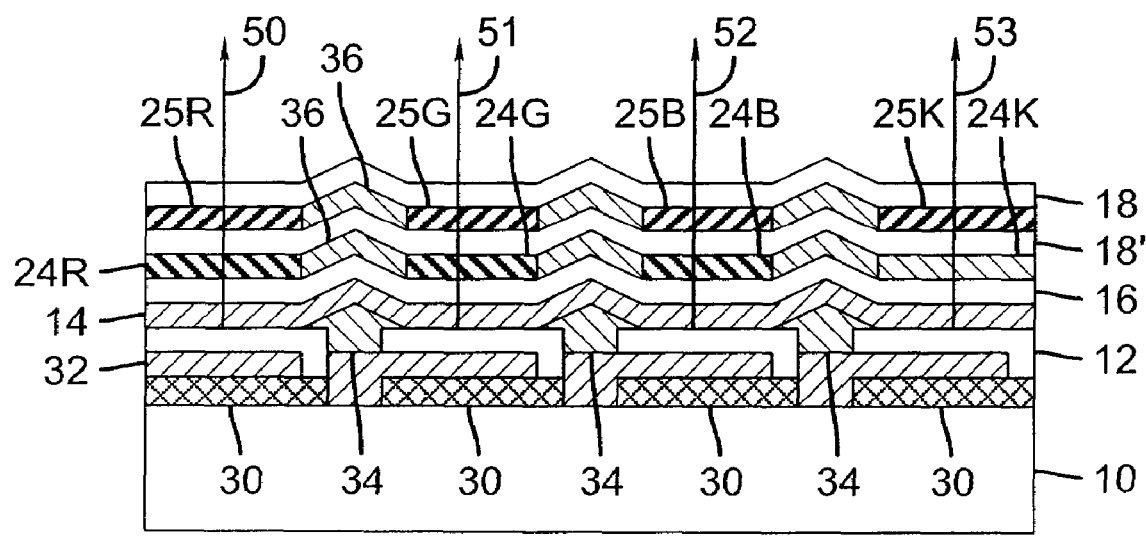
FIG. 8 illustrates a partial cross section of a top-emitter OLED device having multiple dynamic filters according to yet another embodiment of the present invention.

In alternative embodiments of the present invention, additional dynamic color light filters may also be employed for the color light-emitting elements as illustrated in FIG. 8. Such dynamic filters may have a time-variable optical density, either for color or neutral density filters. In this embodiment, additional dynamic filters 25R, 25G, and 25B separated by insulators 36 are responsive to the transparent electrodes 18 and 18' to filter broadband light and form a full-color OLED device and may be controlled to vary the contrast and gamut of the OLED device. The additional dynamic filters 25R, 25G, and 25B and/or dynamic filter 25K may be controlled as a group or independently using vias to electrically connect the electrode 18' with thin-film circuitry 30.

The optical density of the patterned neutral density filter preferably may be matched to the optical density of the color filters to provide equal ambient reflection luminance and/or to provide neutral color ambient reflection. The present invention may also further comprise a color filter filtering emitted light from the additional light-emitting element, for example to adjust the color of the light-emitting element to a specific, desired white-point. In other embodiments of the present invention, it is also possible to further provide an additional neutral density filter filtering emitted light from at least one of the three or more gamut specifying color light-emitting elements.

In various embodiments of the present invention, an OLED information display device may be responsive to the information displayed on the device at a known level for each light-emitting element. For example, if a saturated color is displayed on one or more light emitters of the device, a broadband emitter may not be energized. In this case, a dynamic light filter may be set to the maximum absorption for the broadband emitter, thereby absorbing additional ambient light and increasing the contrast of the OLED device without decreasing any of the light output.

Alternatively, if a largely white color is displayed on the device, a color light emitter may not be energized. In this case, a dynamic additional color light filter may be set to the maximum absorption for the color light emitter, thereby increasing the contrast of the OLED device without decreasing any of the light output.

Assuming the use of broadband light-emitting organic layers in four-element RGBW OLED device having equal-sized elements, color filters that absorb two thirds of the transmitted light, and a neutral density light filter (ND) that absorbs 50% of the transmitted light that passes through it, the table below compares the contrast, reflection, and light output of the present invention as compared to OLED devices suggested by the prior art. The contrast is here defined as the ratio between the percent of emitted light output and the percent of ambient light reflected.

| Format | Light output | Light reflected | Contrast |
| --- | --- | --- | --- |
| RGBW | 50% | 33.3% | 1.5 |
| RGBW with unpatterned ND | 25% | 8.3% | 3 |
| Invention I | 37.5% | 14.6% | 2.57 |
| Invention II | 25% | 8.3% | 3 |

The prior-art design of RGBW employs a common white light emitter and only color filters, while the design of RGBW with ND additionally employs a neutral density filter of 50% over all pixel elements. As is conventionally expected, the neutral density filter reduces the light output by one half while decreasing the light reflected by a factor of four to provide an improved contrast. According to the present invention, the embodiment of Invention I employs a patterned neutral density filter corresponding to the additional, in-gamut pixel element. Hence, the brightness of the colors are undiminished. This embodiment has a greater reflection and a slightly lower contrast than the comparison employing an unpatterned neutral density filter, but advantageously emits 50% more light (relative to the unpatterned ND filter embodiment), and the resulting increased brightness in color emitters with some improvement in contrast may be preferred in some applications.

According to an alternative embodiment of the present invention, the optical density of the color filters is increased (to absorb ⅚ of transmitted light) so that the light transmitted through the color filters is also reduced beyond that of Invention I. Preferably, the increased optical density filter provides a narrower spectral width and purer colored light to increase the color gamut of the display. In such embodiment, the brightness of the colors is reduced as is the light output from the additional pixel element. This embodiment emits the same amount of light and has a similar contrast to the comparison design employing an unpatterned neutral density filter, but the purer colors provide an improved color gamut.

According to various embodiments of the present invention, the luminance and color brightness may be separately adjusted by employing various color filters on the color emitters and neutral density filters on the in-gamut, broadband, and white emitters. This enables a separate adjustment of contrast, color brightness, and luminance in the OLED device.

Conventional color filters found in the art may be employed for the color filters. Likewise, black matrix materials, or carbon, carbon black, pigmented inks, and dyes may be employed for the neutral density filter.

OLED devices of this invention can employ various well-known optical effects in order to enhance their properties if desired. This includes optimizing layer thicknesses to yield maximum light transmission, providing anti-glare or anti-reflection coatings over the display, or providing colored, neutral density, or color conversion filters over the display. Filters, and anti-glare or anti-reflection coatings may be specifically provided over the cover or as part of the cover.

The present invention may also be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

The invention claimed is:

1. A full-color organic light-emitting diode (OLED) device, comprising:
   a) a plurality of light emitting OLED pixels, each pixel having three or more color light-emitting elements for emitting different colors of light specifying a gamut and at least one additional light-emitting element for emitting a color of light within the gamut and wherein the power efficiency of the additional element is higher than the power efficiency of at least one of the three or more gamut elements; and
   b) a patterned neutral density filter selectively located only over the additional light-emitting element to selectively filter only light emitted from the additional light-emitting element.

2. The OLED device of claim 1 wherein the neutral density filter absorbs at least 10% of light in the visible spectrum.

3. The OLED device of claim 1 wherein the neutral density filter is a polarizing filter.

4. The OLED device of claim 3 wherein the polarizing filter is a circular polarizing filter.

5. The OLED device of claim 1 wherein the optical density of the neutral density filter is time-variable.

6. The OLED device of claim 5 wherein the neutral density filter is a photo-chromic, an electro-chromic light filter, or an electrophoretic light filter.

7. The OLED device of claim 5 wherein the optical density of the neutral density filter is adjusted in response to the ambient illumination incident on the OLED device.

8. The OLED device of claim 1 further comprising an additional neutral density filter filtering emitted light from at least one, but not all, of the three or more gamut specifying color light-emitting elements.

9. The OLED device of claim 1 wherein the neutral density filter comprises carbon, carbon black, pigmented inks, or dyes.

10. The OLED device of claim 1 wherein the gamut specifying color light-emitting elements comprise a broadband light emitter and differently colored color filters to emit different colors of light.

11. The OLED device of claim 10 wherein the broadband light emitter emits substantially white light.

12. The OLED device of claim 10 wherein the optical density of the neutral density filter is matched to the optical density of the color filters to provide equal ambient reflection luminance.

13. The OLED device of claim 10 wherein the optical density of the neutral density filter is matched to the optical density of the color filters to provide neutral color ambient reflection.

14. The OLED device of claim 1 further comprising a color filter filtering emitted light from the additional light-emitting element.

15. The OLED device of claim 1 wherein the gamut specifying color light-emitting elements comprise patterned colored light emitters.

* * * * *